United States Patent
Höhn et al.

(10) Patent No.: US 11,431,283 B2
(45) Date of Patent: Aug. 30, 2022

(54) GLAZING UNIT, METHOD FOR THE PRODUCTION THEREOF AND USE THEREOF

(71) Applicant: Fraunhofer-Gesellschaft zur Förderung der angewandten Forschung e.V., Munich (DE)

(72) Inventors: Oliver Höhn, Herbolzheim (DE); Thomas Kroyer, Freiburg (DE); Benedikt Bläsi, Freiburg (DE); Tilmann Kuhn, Hinterzarten (DE); Andreas Hinsch, Oberried (DE)

(73) Assignee: FRAUNHOFER-GESELLSCHAFT ZUR FÖRDERUNG DER ANGEWANDTEN FORSCHUNG E.V., Munich (DE)

( * ) Notice: Subject to any disclaimer, the term of this patent is extended or adjusted under 35 U.S.C. 154(b) by 51 days.

(21) Appl. No.: 16/488,471

(22) PCT Filed: Feb. 23, 2018

(86) PCT No.: PCT/EP2018/054492
§ 371 (c)(1),
(2) Date: Aug. 23, 2019

(87) PCT Pub. No.: WO2018/154045
PCT Pub. Date: Aug. 30, 2018

(65) Prior Publication Data
US 2019/0386607 A1 Dec. 19, 2019

(30) Foreign Application Priority Data
Feb. 27, 2017 (DE) .......................... 102017203105.0

(51) Int. Cl.
*H02S 20/26* (2014.01)
*F24S 80/52* (2018.01)
(Continued)

(52) U.S. Cl.
CPC ................ *H02S 20/26* (2014.12); *E04D 1/16* (2013.01); *E06B 9/24* (2013.01); *F24S 80/52* (2018.05);
(Continued)

(58) Field of Classification Search
CPC ... G02B 5/26; G02B 5/28; G02B 5/22; G02B 5/02; G02B 5/281; G02B 5/0278;
(Continued)

(56) References Cited

U.S. PATENT DOCUMENTS

| 4,554,727 A | 11/1985 | Deckman et al. |
| 2005/0150864 A1 | 7/2005 | Stasiak et al. |

(Continued)

FOREIGN PATENT DOCUMENTS

| CN | 1288521 A | 3/2001 |
| CN | 101809471 A | 8/2010 |

(Continued)

OTHER PUBLICATIONS

G. Ce;tstagno et al "Design method for multilayer interference filters"; Applied Optics/ vol. 19, No. 3 / Feb. 1, 1980 (Year: 1980).*

(Continued)

*Primary Examiner* — Jie Lei
(74) *Attorney, Agent, or Firm* — Crowell & Moring LLP

(57) ABSTRACT

A glazing unit is provided for producing an aesthetically pleasing effect, comprising or consisting of at least one pane, said pane having a first structured surface to which a three-dimensional photonic structure is applied and the average refractive index of the photonic structure being higher than approximately 1.6 or higher than approximately 1.8 or higher than approximately 1.95. A method of producing such a glazing unit and the use thereof is also provided.

19 Claims, 5 Drawing Sheets

(51) Int. Cl.
　　*H02S 40/44* (2014.01)
　　*G02B 5/26* (2006.01)
　　*G02B 19/00* (2006.01)
　　*E06B 9/24* (2006.01)
　　*E04D 1/16* (2006.01)

(52) U.S. Cl.
　　CPC .......... *G02B 5/26* (2013.01); *G02B 19/0004* (2013.01); *G02B 19/0042* (2013.01); *H02S 40/44* (2014.12)

(58) Field of Classification Search
　　CPC ...... G02B 5/585; G02B 1/11; G02B 19/0004; G02B 19/0042; H02S 20/26; H02S 40/44; H02S 40/20; F24S 80/52; F24S 80/525; E06B 9/24; E04D 1/16
　　USPC ........ 359/589, 586, 588, 590, 580, 584, 359
　　See application file for complete search history.

(56) References Cited

U.S. PATENT DOCUMENTS

| | | | |
|---|---|---|---|
| 2008/0316594 | A1 | 12/2008 | Hashiguchi et al. |
| 2009/0101192 | A1 | 4/2009 | Kothari et al. |
| 2009/0153953 | A1 | 6/2009 | Banerjee et al. |
| 2010/0208338 | A1 | 8/2010 | Banerjee et al. |
| 2011/0134515 | A1 | 6/2011 | Banerjee et al. |
| 2015/0249424 | A1 | 9/2015 | Hody Le Caer et al. |
| 2016/0064577 | A1* | 3/2016 | Ballif .............. H01L 31/02167 136/257 |
| 2016/0109628 | A1 | 4/2016 | Weber et al. |
| 2016/0254403 | A1 | 9/2016 | Guo et al. |
| 2017/0123122 | A1* | 5/2017 | Ballif ...................... G02B 5/26 |

FOREIGN PATENT DOCUMENTS

| | | |
|---|---|---|
| CN | 103670222 A | 3/2014 |
| CN | 104919342 A | 9/2015 |
| CN | 105144397 A | 12/2015 |
| CN | 105190381 A | 12/2015 |
| CN | 105283621 A | 1/2016 |
| CN | 106233168 A | 12/2016 |
| DE | 10 2011 012 482 A1 | 8/2012 |
| DE | 10 2013 205 671 A1 | 10/2014 |
| EP | 0 209 728 A2 | 1/1987 |
| EP | 2319813 B1 | 12/2012 |
| JP | 2012-03027 A | 1/2012 |
| JP | 2014-107504 A | 6/2014 |
| JP | 2016-500799 A | 1/2016 |
| KR | 10-2005-0086042 | 8/2005 |
| WO | WO 2004/079278 A1 | 9/2004 |
| WO | WO 2013/056747 A1 | 4/2013 |
| WO | WO 2014/045141 A2 | 3/2014 |
| WO | WO 2014/045144 A1 | 3/2014 |
| WO | WO 2014/170323 A1 | 10/2014 |
| WO | WO 2015/002042 A1 | 1/2015 |
| WO | WO 2015/155356 A1 | 10/2015 |
| WO | WO 2015/155357 A1 | 10/2015 |

OTHER PUBLICATIONS

Chinese Notification of The First Office Action with English translation, dated Jul. 28, 2020, pp. 1-18, Chinese Patent Application No. 201880014107.8, Chinese National Intellectual Property Administration, Beijing, China.

Fuchs Design, "General Catalogue 2017, Glass-, Ceramic Bricks & Accessories," dated 2017, pp. 1-61, published by Fuchs Design GmbH, Kerken, Germany.

International Search Report, issued in International Application No. PCT/EP2018/054492, dated Jun. 1, 2018, pp. 1-3, European Patent Office, Rijswijk, Netherlands.

Wei Zhang et al., "Highly Efficient Perovskite Solar Cells with Tunable Structural Color," Nano Letters, dated Feb. 4, 2015, pp. 1698-1702, vol. 15, published online by American Chemical Society at URL https://pubs.acs.org/doi/pdf/10.1021/nl504349z?rand=74437wxb.

Georg von Freymann et al., "Three-Dimensional Nanostructures for Photonics," Advanced Functional Materials, dated Mar. 29, 2010, pp. 1038-1052, vol. 20, published online by Wiley-VCH Verlag GmbH & Co. KGaA, Weinheim, Germany, at URL https://doi.org/10.1002/adfm.200901838.

"SGG Securit Albarino", dated May 2009, pp. 1-2, published by Saint-Gobain Solar, Aachen, Germany.

J. H. Selj et al., "Reduction of optical losses in colored solar cells with multilayer antireflection coatings," dated May 4, 2011, pp. 2576-2582, Solar Energy Materials & Solar Cells, vol. 95, Issue 9, published online by Elsevier B.V. at URL https://doi.org/10.1016/j.solmat.2011.03.005.

Efthymios Klampaftis, "Color, Graphic Design and High Efficiency for Photovoltaic Modules," ISBN 978-1-4799-4398-2, dated Jun. 8, 2014, pp. 25-29, published in 2014 IEEE 40th Photovoltaic Specialist Conference, Denver, CO, at URL https://doi.org/10.1109/PVSC.2014.6925025.

A. Schüler et al., "Thin film multilayer design types for colored glazed thermal solar collectors," Solar Energy Materials & Solar Cells, dated May 10, 2005, pp. 219-231, vol. 89, Issues 2-3, published online by Elsevier at URL https://doi.org/10.1016/j.solmat.2004.11.015.

Kyungjae Chung et al., "Flexible, Angle-Independent, Structural Color Reflectors Inspired by Morpho Butterfly Wings," Advanced Materials, dated Apr. 10, 2012, pp. 2375-2379, vol. 24, published online by Wiley-VCH Verlag GmbH & Co. KGaA, Weinheim, Germany, at URL https://doi.org/10.1002/adma.201200521.

Marius Peters et al., "Efficiency limit and example of a photonic solar cell," Journal of Applied Physics, dated Aug. 16, 2011, pp. 1-6, vol. 110, Issue 4, published online by American Institute of Physics at URL https://doi.org/10.1063/1.3622669.

Jörg Schilling, "2 Grandlagen: Photonische Kristalle," Machine English translation "2 Basics: Photonic Crystals," dated May 24, 2002, pp. 1-14, published online by Sundoc at URL https://sundoc.bibliothek.uni-halle.de/diss-online/02/02H139/t3.pdf.

Chinese Notification of The First Office Action with English translation, dated Mar. 12, 2021, pp. 1-10, Chinese Patent Application No. 201880014107.8, Chinese National Intellectual Property Administration, Beijing, China.

Chung, K. et al. "Flexible, Angle-Independent, Structural Color Reflectors Inspired by Morpho Butterfly Wings," *Adv. Mater.*, 24, 2012, pp. 2375-2379.

* cited by examiner

GLAZING UNIT, METHOD FOR THE PRODUCTION THEREOF AND USE THEREOF

CROSS-REFERENCE TO RELATED APPLICATIONS

This application is a 371 nationalization of international patent application PCT/EP2018/054492 filed Feb. 23, 2018, which claims priority under 35 USC § 119 to German patent application 102017203105.0 filed Feb. 27, 2017. The entire contents of each of the above-identified applications are hereby incorporated by reference.

DETAILED DESCRIPTION

Figure 1:
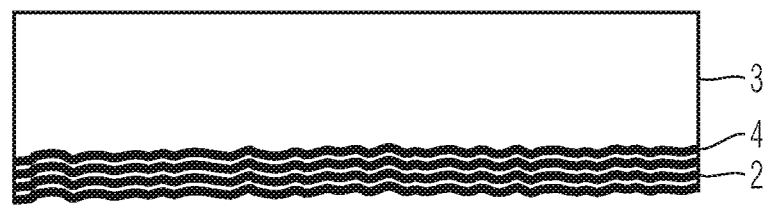
FIG. 1 shows a first embodiment of a glazing unit according to the invention.

The invention relates to a glazing unit comprising at least one glass and a method for the production thereof and use thereof. Glazing units of the above mentioned type can be used as façade elements, for example.

The market for building-integrated photovoltaics (BIPV) and building-integrated solar thermal energy has great potential both nationally and globally. The design possibilities which are very limited to date are an obstacle to the broad acceptance and use of such technologies in buildings. In order to increase acceptance and attractiveness, there is an increasing demand for solar modules with photovoltaic cells and thermal solar collectors, the function of which can be masked with the help of color effects and which are therefore no longer perceptible. Particularly desired is the possibility to influence the color in a targeted and individual way (e.g. structuring with your own company logo) and at the same time achieve the highest possible degree of efficiency. The color impression of the modules should here be as independent as possible of the viewing angle and glare effects should be avoided depending on the location. Previous concepts either show an intolerable loss of efficiency, are limited in their choice of colors or cannot be implemented industrially.

If, for example, BIPV modules should be made more visually appealing, there are basically two different options. It can be tried to design the module in such a way that the cells are not perceptible by inserting a colored or scattering glass pane in front of the cells. With this option, the solar modules are no longer visible. It is here important to minimize the previously unavoidable reduction in efficiency caused by the glass pane so that a sufficient effect on the energy balance of the building can be achieved.

Alternatively, the cells can be left visible and consciously used as a design element by selecting a special shape, size or position of the solar cells.

In the case of the first option, the colored module cover glass can be used as the colored glass pane. One possibility is the coloring or printing of the glass with absorbent color pigments. This allows a relatively free and simple color selection, but due to the absorption of part of the electromagnetic spectrum by the color pigments, high losses occur if a real invisible photovoltaic is to be achieved. This practically excludes wide acceptance. Luminescent materials can also be used, with the overall efficiency remaining good. However, even when luminescent materials are used, industrial implementation is still a long way off and the choice of color depends on the color of the available luminescent materials and is therefore limited.

The use of a selectively reflective cover layer has only a minimal effect on the overall efficiency and opens up further scope for design. A disadvantage is the angle dependence of the color impression, which is usually undesirable in buildings.

A glazing unit with a coating that reduces the problem of angle dependence is known from US 2015/0249424 A1. This coating consists of a complex layer structure and leads to a reflection loss of 8%-12%. A corresponding product (Kromatix™) is available in six different colors. However, this technology has considerable disadvantages. The angle-independent color impression is based on a very special, complex thin-film filter, which limits the number of possible colors and degrees of freedom as well as the achievable color saturation.

Based on this prior art, the object of the invention is therefore to provide a glazing unit with improved properties.

According to the invention, this object is achieved by a glazing unit, a method for producing this glazing unit, a solar module comprising the glazing unit and a thermal solar collector. Advantageous developments of the invention can be found in the subclaims The invention proposes a glazing unit for the esthetically pleasing effect e.g. of façade surfaces and roof surfaces, which comprises or consists of at least one photonic structure and a glass, the glass having a first structured surface to which the photonic structure is applied.

The glazing unit according to the invention contains at least one transparent or translucent material as a substrate, which is hereinafter referred to as glass. The substrate in the sense of the present invention can also have a multi-layer structure, for example as laminated safety glass, and therefore also contain polymer films or layers. In some embodiments of the invention, irrespective of the designation "pane", the substrate can also consist entirely of at least one polymer which is subsequently coated with the described structured surface and the photonic structure.

Photonic structures in the sense of the present description are modulations of the refractive index occurring or created in transparent or translucent solids. The photonic structure thus contains at least first spatial regions with a first refractive index and second spatial regions with a second refractive index, so that the propagation of light is influenced by diffraction, reflection at interfaces and/or interference. For this purpose, the refractive index is modulated in at least one spatial direction in dimensions which are in the same order of magnitude as the wavelength of the relevant light.

In some embodiments of the invention, the first and second spatial areas can be implemented in the form of a plurality of thin films of different composition or two different compositions and optionally different thicknesses.

In some embodiments, the optical layer thickness of the individual layers can correspond to about a quarter of the design wavelength at which the main reflection maximum (0th harmonic) appears.

The photonic structures used according to the invention are designed to reflect a first partial spectrum of incoming electromagnetic radiation and to transmit a second partial spectrum of incoming electromagnetic radiation, wherein the reflected proportion corresponds to a higher harmonic and lies in the visible spectral range. A higher harmonic here has a shorter wavelength or a shorter mean wavelength of a wavelength distribution than the main reflection maximum (0th harmonic). In some embodiments of the invention, the 2nd or 3rd harmonic can be used. In dispersion-free media, the higher harmonics occur at integer multiples of the frequency of the main reflection maximum (0th harmonic).

According to the invention, it was recognized that the use of a higher harmonic of a thin film filter in the visible spectral range offers a higher color saturation and a multitude of possible colors and design options. By combining the photonic structure with the structured surface according to the invention, the angle dependence of the color impression can be reduced or eliminated. A building provided with the glazing unit according to the invention has the identical color impression from many or all viewing angles.

The first and second spatial regions of the photonic structure can be arranged non-periodically.

The first and second room areas can be arranged periodically. Coatings of the same thickness and composition can be used for this purpose. The photonic structure can, for example, reflect light of a pre-defined wavelength or wavelength range and transmit other wavelengths by means of interference effects. The reflection wavelength or the maximum value of the wavelength range is also referred to below as the Bragg wavelength. The width of the reflected wavelength range at perpendicular incidence may be less than 75 nm, less than 65 nm or less than 60 nm.

According to the invention, such a photonic structure is located on a structured surface of the glass. For this purpose, the glass has at least one first structured surface to which the photonic structure is applied. This structure is therefore referred to in the following as the three-dimensional photonic structure. The first structured surface can comprise a partial area of one side of the glass or a complete side of the glass can be provided with the structured surface. A structured surface in the sense of the present invention refers to a structure that has elevations and depressions. In some embodiments of the invention, the RMS roughness can be between about 30 nm and about 100 µm or between about 80 nm and about 10 µm. The structured surface can be structured periodically or aperiodically.

According to the invention, a thin film filter is applied as a photonic structure to a structured surface in some embodiments. This thin film filter is thus also structured, so that it cannot be regarded as a flat thin film filter as would otherwise be the case. The thin film filter can nevertheless be designed as a Bragg filter or a similar filter. According to the invention, however, it was recognized that some properties of the structure designed as a thin film filter change significantly when applied to a structured glass, so that one can no longer speak of a one-dimensional thin film filter. The main reflection maxima and also higher harmonics of the thin film structure are preserved with this realization form, wherein their exact position can be influenced by the layer sequence of the individual layers of the thin film filter. One of the main influences of the structured surface is the influence on the angle dependence of the reflection peaks. A flat thin film filter on a structured surface is therefore also referred to as a three-dimensional photonic structure in the sense of the present description.

In some embodiments, the mean refractive index of the glazing unit can be greater than about 1.6 or greater than about 1.8 or greater than about 1.95, all determined at a wavelength of 550 nm. The mean refractive index is defined as the averaging of the refractive index weighted by the volume proportions of the respective material. This index can be determined by the following method steps: Determination of the total thickness of all layers $D_{ges}$ of the thin film filter of the photonic structure, e.g. by light microscopy or scanning electron microscopy, determination of the number of different layers of the thin film filter, e.g. with EDX, thus determination of the number of symmetry elements $N_{sym}$ of the thin film filter, determination of the wavelength of the main peak $LD_{HP}$, determination of the wavelength of the mth harmonic $LD_m$, determination of m by dividing the peak wavelengths: $m=LD_{HP}/LD_m-1$ and rounding to a whole number, calculating the mean refractive index n according to the following formula: $n=N_{sym}/D_{ges}\times 0.5\times LD_m\times (m+1)$ According to the invention, at least one first side of the glass is provided with the photonic structure according to the invention, which is arranged on a structured surface. In some embodiments, this first side can be the inner side facing away from the weather, so that the photonic structure is protected from weathering and soiling. In other embodiments of the invention, the first side of the glass with the photonic structure according to the invention can be the surface which is on the outside during operation or after the final assembly. This can increase the color saturation.

In some embodiments, the photonic structure can have a higher harmonic in the visible spectral range. This can be done by increasing the layer thicknesses of the photonic structure. This feature has the effect that the spectral width of the reflected wavelength range becomes smaller. A higher harmonic distinguishes itself in that the reflected wavelength or the average value of a wavelength range is smaller than the reflected wavelength or the average value of a wavelength range of the 0th harmonic or the main wavelength. In some embodiments of the invention, the higher harmonic is the 2nd or 3rd harmonic. This can increase the color saturation in reflection and transmission. This means that a larger proportion of the light spectrum is available for use by photovoltaics or thermal collectors and at the same time an observer perceives a homogeneously colored surface instead of individual cells.

In some embodiments of the invention, the reflection losses of the glazing unit can be less than 12% or less than 9%.

By applying the three-dimensional photonic structure according to the invention to a module glass of a photovoltaic module, the glazing unit according to the invention can be used as part of a photovoltaic module. The manufacturing process of the photovoltaic module can remain virtually unchanged.

Nevertheless, the color design is freely selectable, so that the photovoltaic modules according to the invention can have a wider range of application. The photovoltaic modules can be used on surfaces on which the use of conventional photovoltaic modules has so far been prohibited for design reasons. In the same way, thermal solar collectors can also be equipped with the glazing unit according to the invention.

Furthermore, glazing units with the selective layer can be used directly without lamination, e.g. in non-laminated photovoltaic modules.

In some embodiments of the invention, the photonic structure can have first layers containing a first material having a first refractive index and the photonic structure can have second layers containing a second material having a second refractive index, wherein the first refractive index is between about 1.5 and about 2.2 and the second refractive index is between about 1.8 and about 2.5. In some embodiments of the invention, the refractive index contrast can be between about 0.2 and about 0.9. This increases the color saturation and the reflection losses can be further reduced.

In some embodiments of the invention, the three-dimensional photonic structure has or consists of a thin film filter, wherein the thin film filter can be a periodic thin film filter, in particular a Bragg filter. The Bragg filter can here alternately have or consist of layers of a first material and a second material. The first and/or the second material can contain or consist of $ZrO_2$ and/or $Nb_2O_5$ and/or $TiO_2$ and/or $Si_3N_4$ and/or $SiO_2$ and/or AlN, $SnO_2$ and/or $Al_2O_3$ and/or $HfO_2$ and/or $Ta_2O_5$ and/or $SiO_xN_y$ and/or $AlO_xN_y$ and/or ZnO and/or $Bi_2O_3$ and/or $In_2O_3$ and/or $WO_3$ and/or $MoO_3$. In some embodiments of the invention, the first and/or second material can additionally contain a dopant.

Embodiments of Bragg filters are the following layer structures a) to c):

a) $Si_3N_4$ in particular in a thickness of 140 nm, $TiO_2$ in particular in a thickness of 170 nm, $Si_3N_4$ in particular in a thickness of 200 nm, $TiO_2$ in particular in a thickness of 170 nm and $Si_3N_4$ in particular in a thickness of 140 nm, or b) $Si_3N_4$ in particular in a thickness of 165 nm, $TiO_2$ in particular in a thickness of 190 nm, $Si_3N_4$ in particular in a thickness of 240 nm, $TiO_2$ in particular in a thickness of 190 nm and $Si_3N_4$ in particular in a thickness of 165 nm, or c) $Si_3N_4$ in particular in a thickness of 120 nm, $TiO_2$ in particular in a thickness of 140 nm, $Si_3N_4$ in particular in a thickness of 170 nm, $TiO_2$ in particular in a thickness of 140 nm and $Si_3N_4$ in particular in a thickness of 120 nm.

Figure 7:
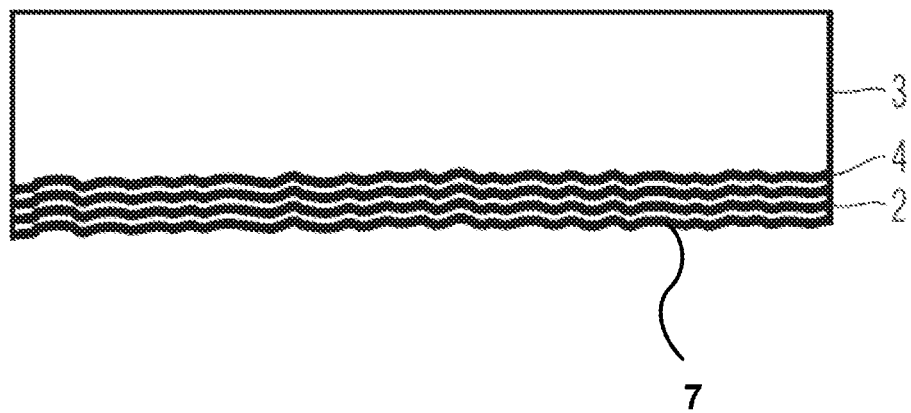
FIG. 7 shows a seventh embodiment of the glazing unit according to the invention.

In order to avoid oxidation of the $Si_3N_4$ layers when they form an outer layer of the photonic structure, a passivation layer 7 can be placed thereon as shown in FIG. 7. The passivation layer 7 can contain or consist of $SiO_2$ and, for example, have a thickness of about 120 nm to about 210 nm.

Examples of photonic structures and the resulting color impression of the glazing units are given in the following table:

| | |
|---|---|
| green | Structured glass/$Si_3N_4$ 140 nm/$TiO_2$ 170 nm/$Si_3N_4$ 200 nm/$TiO_2$ 170 nm/$Si_3N_4$ 140 nm/$SiO_2$ 140 nm |
| red | Structured glass/$Si_3N_4$ 165 nm/$TiO_2$ 190 nm/$Si_3N_4$ 240 nm/$TiO_2$ 190 nm/$Si_3N_4$ 165 nm/$SiO_2$ 210 nm |
| blue | Structured glass/$Si_3N_4$ 120 nm/$TiO_2$ 140 nm/$Si_3N_4$ 170 nm/$TiO_2$ 140 nm/$Si_3N_4$ 120 nm/$SiO_2$ 120 nm |
| green alternative | Structured glass/$Si_3N_4$ 140 nm/$TiO_2$ 170 nm/$Si_3N_4$ 140 nm/$SiO_2$ 140 nm |
| red alternative | Structured glass/$Si_3N_4$ 165 nm/$TiO_2$ 190 nm/$Si_3N_4$ 165 nm/$SiO_2$ 210 nm |
| blue alternative | Structured glass/$Si_3N_4$ 120 nm/$TiO_2$ 140 nm/$Si_3N_4$ 120 nm/$SiO_2$ 120 nm |

In some embodiments, the optional cover layer 7 which contains or consists of $SiO_2$ can also be omitted. In order to protect against environmental influences, such glazing units can be laminated without a final $SiO_2$ layer in at least one polymer film. If such a lamination is omitted, the final $SiO_2$ layer with a thickness between about 100 nm and about 230 nm can reduce the total reflection and/or reduce the degeneration due to environmental influences. If it is intended to laminate the glazing unit, a final $SiO_2$ layer can improve the connection to the laminating film. For this purpose, the final $SiO_2$ layer can also be thinner and, for example, have a thickness between about 5 nm and about 50 nm or between about 3 nm and about 100 nm.

The term "structured glass" here means a glass having a first structured surface to which a thin film filter is applied as a three-dimensional photonic structure.

In some embodiments, the glazing unit has a plurality of three-dimensional photonic structures, each reflecting different wavelength ranges. In some embodiments of the invention, 2 or 3 three-dimensional structures can be used which produce different colors, e.g. red, green and blue. It is thus possible to span a wide color space by additive color mixing.

Such a wide color space can also be achieved by using a single three-dimensional photonic structure with multiple reflection peaks with wavelengths or wavelength ranges that differ from one another. In some embodiments of the invention, this can be achieved by non-periodic structures or by periodic structures with a plurality of different layer thicknesses.

In some embodiments, the glass present in the glazing unit can have a second structured surface opposite the first structured surface. The second structured surface can be used as an anti-reflective layer, for example. In this embodiment, an even higher color saturation can be achieved by the eliminated reflection of the front side.

In some embodiments, the glazing unit can have first partial areas which have a first photonic structure and second partial areas which have a second photonic structure or no photonic structure. If partial areas of the glazing unit have no photonic structure, they appear black. If partial areas of the glazing unit have a photonic structure that differs from other partial areas, they can appear in a different color if the layer thicknesses or the material of the individual layers differ. In other embodiments of the invention, partial areas can be provided with the identical Bragg filter but exhibit a lower roughness or a different surface structuring. This can result in an angle dependence of the color impression. By dividing the glazing into first and second sections, patterns, logos or other design elements can be created on the glazing unit.

According to the invention, a method for producing a glazing unit according to the invention is also provided. Here, the first structured surface is first produced on the glass and then the three-dimensional photonic structure is applied to this first structured surface.

In some embodiments, the three-dimensional photonic structure can be applied to the first structured surface of the glass by sputtering. This is a widely used process for coating architectural glass so that the glazing unit according to the invention can easily be manufactured with existing equipment. In this process, it is therefore possible to use conventional cover glasses for solar modules and thermal solar collectors, which can then be used in the usual way for the further production of solar modules or thermal solar collectors.

In some embodiments, the first structured surface of the glass can be produced by sandblasting, embossing, etching, casting or rolling. As already mentioned above, the glazing unit of some embodiments can have a second structured surface. This unit can also be produced by sandblasting, embossing, etching, casting or rolling. If a subdivision into first and second partial areas with different roughness is desired, optional masking can be carried out. The mask can be applied in particular by a printing process.

If the glazing unit has first partial areas which have a first photonic structure and second partial areas which have a second photonic structure or no photonic structure, a mask can also be applied before the photonic structure is generated. In some embodiments of the invention, this can be done by a printing process. If the mask is made of organic material, it can be removed by ashing. In some embodiments of the invention, ashing can take place simultaneously with a heat treatment to cure the glazing unit.

In addition, a solar module is provided according to the invention which has a glazing unit according to the invention, in particular as described above. Here, the glazing unit according to the invention can be present in solar modules known per se. In particular, the solar module can comprise the glazing unit, a first embedding film, a solar cell, a second embedding film and a backside film. Examples of embedding film materials are ethylene vinyl acetate and/or silicone.

In some embodiments, the glazing unit can be applied to a thermal solar collector known per se.

The glazing unit according to the invention can be used for the esthetically pleasing effect of a plurality of most different areas and surfaces. It is here possible that part of the area/surface is glazed with the glazing unit according to the invention and other parts of the area/surface are designed in the usual way.

The glazing unit according to the invention can be used as a cover glass for building-integrated photovoltaics (BIPV), building-integrated solar thermal systems, roof-mounted systems with special color design, as normal non-solar glazing, for example in the parapet area of fully glazed buildings, or as colored vehicle glazing. In the latter case, a lettering, a pattern or a logo can be applied and the lettering still allows light to pass through the glazing into the room behind it.

The invention is explained in more detail below by means of drawings and embodiments without limiting the general concept of invention.

FIG. 1 shows a first embodiment of the glazing unit 1 according to the invention. FIG. 1 shows a three-dimensional photonic structure 2 and a glass 3, the glass 3 having a first structured surface 4 to which the three-dimensional photonic structure is applied.

The glass 3 is a carrier material for the three-dimensional photonic structure. The glass 3 is a transparent or translucent material, which can also be composed of a plurality of layers of different materials that are not shown. For example, the glass 3 can be provided with a tempered layer or, as laminated safety glass, can contain at least one polymer film which is fully bonded to adjacent glass layers. In some embodiments of the invention, irrespective of the designation "glass", the substrate can also consist entirely of at least one polymer to which the described structured surface and photonic structure are subsequently applied.

In this first embodiment, the three-dimensional photonic structure 2 is a thin-film filter consisting of a plurality of alternating individual layers, each containing $Si_3N_4$ or $TiO_2$. By selecting the layer distances, the reflection wavelength and thus the color design of glazing unit 1 can be selected in such a way that it shows a specific color, for example red. The layer distances can be selected between about 100 nm and about 250 nm. The number of individual layers can be between 1 and about 100 or between about 3 and about 20.

The individual layers of the photonic structure 2 are applied to a structured surface 4, which can be produced by sandblasting, rolling, etching, casting or embossing in a manner known per se.

Since the glass 3 has a structured surface 4, the thin-film filter is also structured so that it cannot be regarded as a flat thin-film filter as would otherwise be the case. The thin film filter can nevertheless be designed as a Bragg filter or a similar filter. According to the invention, however, it was recognized that some properties of the structure designed as a thin-film filter change significantly when it is applied to a structured glass 3, so that one can no longer speak of a one-dimensional thin-film filter. The main reflection maxima and higher harmonics of the thin film structure are retained in this realization form, wherein their exact position can be influenced by the layer sequence of the individual layers of the thin film filter. One of the main influences of the structured surface is an influence on the angle dependence of the reflection peaks. When the viewing angle is changed, the color design of glazing unit 1 shows less variation than that of known colored glazing units. At the same time, the transmission for the spectrum that can be used for solar energy generation is greater than that for known, in particular pigmented colored glazing units.

Figure 2:
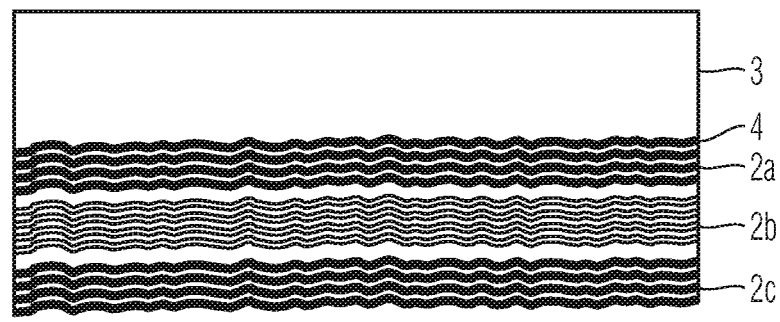
FIG. 2 shows a second embodiment of the glazing unit according to the invention.

FIG. 2 shows a second embodiment of the glazing unit 1 according to the invention, in which three different three-dimensional photonic structures 2a, 2b, 2c have been created on the structured surface 4 of the glass 3. They differ in that they show different colors, i.e. they reflect light at different wavelengths. In this way it is possible to also create mixed colors by overlaying three basic colors and thus further increase the design possibilities.

The different three-dimensional photonic structures 2a, 2b and 2c can be applied to the previously structured surface 4 of the glass 3 by sputtering one after the other. The photonic structures 2a, 2b and 2c can differ in composition and/or thickness and/or number of individual layers.

Figure 3:
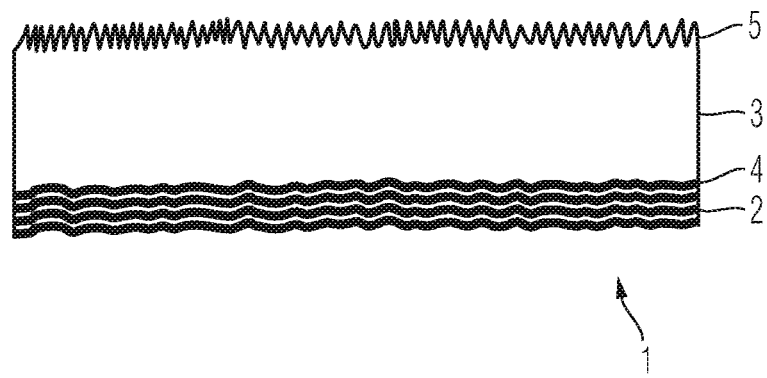
FIG. 3 shows a third embodiment of the glazing unit according to the invention.

The third embodiment of the glazing unit 1 according to the invention that is illustrated in FIG. 3 shows that the glass 3 has a second structured surface 5 which is opposite the first structured surface 4 of the glass 3.

The second structured surface 5 can be used to avoid unwanted reflections on the surface, which could dazzle passers-by and further reduce the intensity by passing through the glazing unit.

Figure 4:
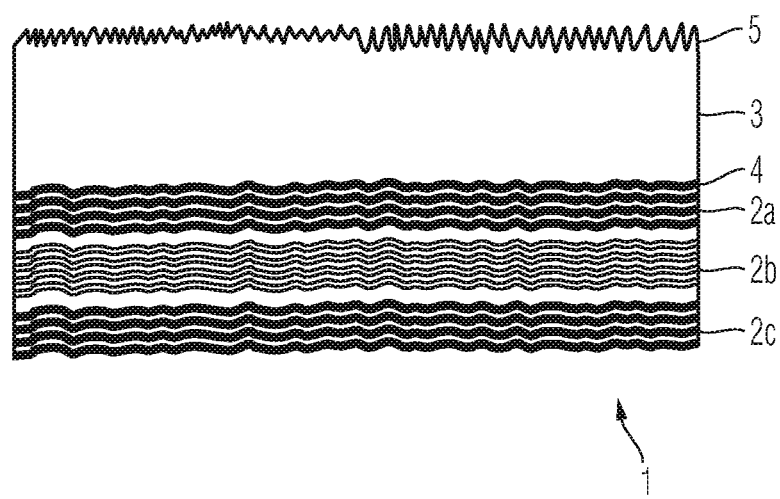
FIG. 4 shows a fourth embodiment of the glazing unit according to the invention.

The fourth embodiment of the glazing unit 1 according to the invention also has a second structured surface 5, a glass 3 and a first structured surface 4. In this respect, it corresponds to the third embodiment of the glazing unit according to the invention that is shown in FIG. 3. However, the glazing unit 1, as shown in FIG. 4, has three different three-dimensional photonic structures 2a, 2b and 2c, similar to FIG. 2, which create a different color impression, so that the overall impression of a mixed color is created.

Figure 5A:
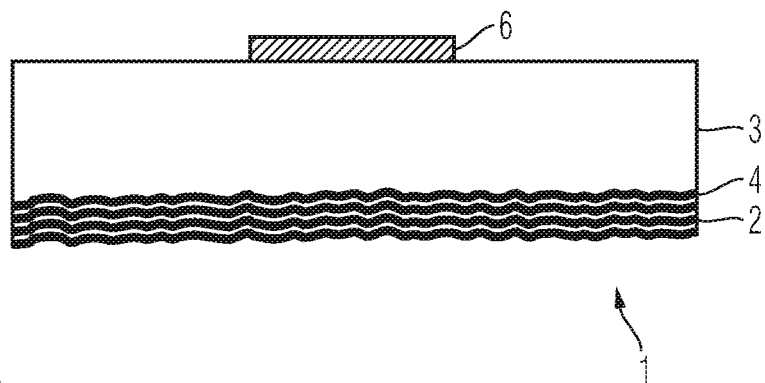
FIG. 5a shows a fifth embodiment of the glazing unit according to the invention in cross section.
Figure 5B:
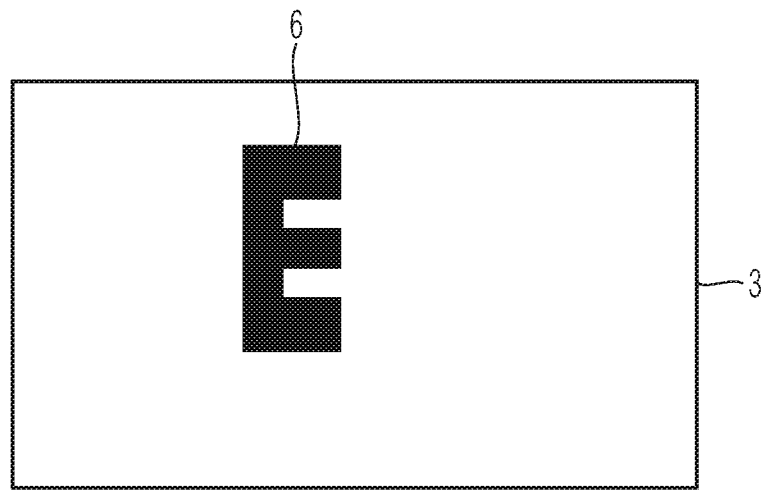
FIG. 5b shows a fifth embodiment of the glazing unit according to the invention in a plan view.

The fifth embodiment of the glazing unit according to the invention that is shown in FIGS. 5a and 5b has a three-dimensional photonic structure 2, a structured surface 4 and a glass 3. On the surface of the glass 3 there is a design element 6, which can be created in the simplest case with an adhesive film. FIG. 5a shows this in cross-section and FIG. 5b in a plan view, which illustrates the design element in the form of a letter for illustrative purposes.

However, an advantage is that for producing a design element the glazing unit has first partial areas which have a first photonic structure and second partial areas which have a second photonic structure or no photonic structure. If partial areas of the glazing unit have no photonic structure, they appear black. If selected partial areas of the glazing unit have a photonic structure that differs from other partial areas, they can appear in a different color if the layer thicknesses and/or the material of the individual layers and/or the number of individual layers differ. In other embodiments of the invention, partial areas can be provided with the identical Bragg filter, but exhibit a lower roughness or a different surface structuring. This can result in a greater angle dependence of the color impression. By dividing the glazing into first and second sections, patterns, logos or other design elements can be created on the glazing unit. At the same time, the high transmission of the invention over the entire surface remains a major advantage of the invention.

Figure 6:
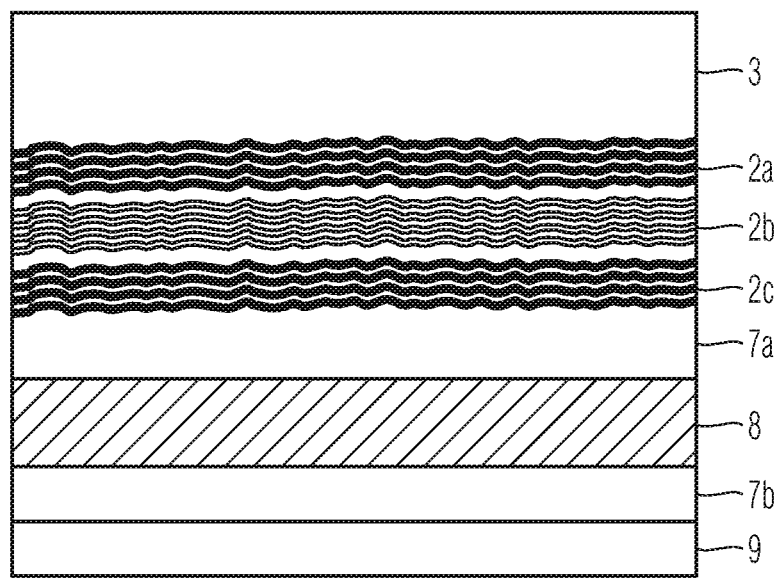
FIG. 6 shows a sixth embodiment of the glazing unit according to the invention.

FIG. 6 shows a sixth embodiment of the invention. It shows how a glazing unit 1 according to the invention is installed in a solar module. The solar module here has the glazing unit 1 as a cover glass.

The glazing unit according to the invention with the glass 3 and the photonic structure 2 is located on a first embedding film 7a, which is made of ethylene vinyl acetate or silicone, for example. Furthermore, the solar module contains a second embedding film 7b. The embedding films 7a, 7b include at least one photovoltaic cell 8, which can be a photovoltaic cell known per se. The invention does not teach the use of a particular cell as a solution principle. Finally, the solar module has a standard backside film 9. Such solar modules can be used for the building-integrated photovoltaics.

Of course, the invention is not limited to the illustrated embodiments. Therefore, the above description should not be regarded as restrictive but as explanatory.

The following claims are to be understood in such a way that a stated feature is present in at least one embodiment of the invention. This does not exclude the presence of further features. If the claims and the above description define "first" and "second" embodiments, this designation is used to distinguish between two similar embodiments without determining a ranking order.

To clarify the use of and to hereby provide notice to the public, the phrases "at least one of <A>, <B>, ... and <N>" or "at least one of <A>, <B>, <N>, or combinations thereof" or "<A>, <B>, ... and/or <N>" are defined by the Applicant in the broadest sense, superseding any other implied definitions hereinbefore or hereinafter unless expressly asserted by the Applicant to the contrary, to mean one or more elements selected from the group comprising A, B, ... and N. In other words, the phrases mean any combination of one or more of the elements A, B, ... or N including any one element alone or the one element in combination with one or more of the other elements which may also include, in combination, additional elements not listed. Unless otherwise indicated or the context suggests otherwise, as used herein, "a" or "an" means "at least one" or "one or more."

The invention claimed is:

1. A glazing unit for an esthetically pleasing effect, the glazing unit comprising:
a glass, wherein the glass has a first surface having a RMS roughness of 30 nm to 100 μm to which a photonic layer structure is applied which is configured to reflect a first partial spectrum of incident electromagnetic radiation and to transmit a second partial spectrum of incident electromagnetic radiation, the reflected proportion corresponding to a higher harmonic and being in the visible spectral range, wherein the photonic layer structure includes a Bragg filter comprising a plurality of layers, each layer having a thickness that is in a range from 120 nm up to 240 nm, wherein the glazing unit as part of a photovoltaic module has a reflection loss of less than 12%.

2. The glazing unit according to claim 1, wherein the mean refractive index of the photonic layer structure is greater than about 1.6 or greater than about 1.8 or greater than about 1.95.

3. The glazing unit according to claim 1, wherein the photonic layer structure comprises first layers containing a first material having a first refractive index and the photonic layer structure comprises second layers containing a second material having a second refractive index, the first refractive index being between about 1.5 and about 2.2 and the second refractive index being between about 1.8 and about 2.5.

4. The glazing unit according to claim 1, wherein the photonic layer structure has one of the following layer structures:
$Si_3N_4$ in a thickness of 140 nm, $TiO_2$ in a thickness of 170 nm, $Si_3N_4$ in a thickness of 200 nm, $TiO_2$ in a thickness of 170 nm and $Si_3N_4$ in a thickness of 140 nm, or
$Si_3N_4$ in a thickness of 165 nm, $TiO_2$ in a thickness of 190 nm, $Si_3N_4$ in a thickness of 240 nm, $TiO_2$ in a thickness of 190 nm and $Si_3N_4$ in a thickness of 165 nm, or
$Si_3N_4$ in a thickness of 120 nm, $TiO_2$ in a thickness of 140 nm, $Si_3N_4$ in a thickness of 170 nm, $TiO_2$ in a thickness of 140 nm and $Si_3N_4$ in a thickness of 120 nm, or
$Si_3N_4$ in a thickness of 140 nm, $TiO_2$ in a thickness of 170 nm and $Si_3N_4$ in a thickness of 140 nm, or
$Si_3N_4$ in a thickness of 165 nm, $TiO_2$ in a thickness of 190 nm and $Si_3N_4$ in a thickness of 165 nm, or
$Si_3N_4$ in a thickness of 120 nm, $TiO_2$ in a thickness of 140 nm and $Si_3N_4$ in a thickness of 120 nm.

5. The glazing unit as claimed in claim 4, further comprising an $SiO_2$ layer having a thickness of about 100 nm to about 230 nm or of about 3 nm to about 100 nm as a cover layer completing the layer structure.

6. The glazing unit according to claim 1, wherein the glazing unit comprises a plurality of photonic structures, each reflecting a different first partial spectrum than the other respective ones of the photonic structures.

7. The glazing unit according to claim 1, wherein the glass has a second surface located opposite the first surface of the glass, the second surface having a RMS roughness of 30 nm to 100 μm.

8. The glazing unit according to claim 7, wherein a second photonic layer structure is arranged on the second structured surface.

9. The glazing unit according to claim 1, wherein the glazing unit comprises first surface regions having a first photonic layer structure and second surface regions having a second photonic layer structure or no photonic structure.

10. The glazing unit according to claim 1, wherein the glass is at least one partial area of: a glass brick, a glass roof tile, or a window glass.

11. The glazing unit of claim 1 included in a thermal solar collector.

12. The glazing unit of claim 1, wherein the first surface of the glass has a RMS roughness of 80 nm to 10 μm.

13. A method for producing a glazing unit for an esthetically pleasing effect, the unit comprising a photonic layer structure and a glass, the method comprising:
providing the glass,
forming a first surface having a RMS roughness of 30 nm to 100 μm on the glass, and
applying the photonic layer structure to the first surface so that the first surface is configured to reflect a first partial spectrum of incident electromagnetic radiation and to transmit a second partial spectrum of incident electromagnetic radiation, the reflected proportion corresponding to a higher harmonic and being in the visible spectral range, the photonic layer structure including a Bragg filter comprising a plurality of layers, each layer having a thickness that is in a range from 120 nm up to 240 nm, wherein the glazing unit as part of a photovoltaic module has a reflection loss of less than 12%.

14. The method according to claim 13, wherein the photonic layer structure is applied to the first surface of the glass by sputtering.

15. The method according to claim 13, wherein the first surface is produced by sandblasting, etching, embossing, casting or rolling.

16. The method according to claim 13, wherein a mask is produced on the first surface before the application of the photonic structure, and the mask is removed after the application of the photonic structure.

17. The method according to claim 16, wherein the mask is removed by ashing, and/or the mask is produced by printing.

18. The method according to claim 16, wherein the mask is removed by ashing at the same time as the glazing unit is cured.

19. A glazing unit comprising:

a glass, wherein the glass has a first surface having a RMS roughness of 30 nm to 100 μm to which a photonic layer structure is applied which is configured to reflect a first partial spectrum of incident electromagnetic radiation and to transmit a second partial spectrum of incident electromagnetic radiation, the reflected proportion corresponding to a higher harmonic and being in the visible spectral range, wherein the photonic layer structure includes a Bragg filter comprising a plurality of layers, wherein the glazing unit as part of a photovoltaic module has a reflection loss of less than 12%.

* * * * *